United States Patent [19]

Schiavone

[11] 4,180,602

[45] Dec. 25, 1979

[54] ELECTROLESS PLATING OF POLYVINYLIDENE FLUORIDE

[75] Inventor: Lawrence M. Schiavone, Howell, N.J.

[73] Assignee: Bell Telephone Laboratories, Incorporated, Murray Hill, N.J.

[21] Appl. No.: 892,107

[22] Filed: Mar. 31, 1978

[51] Int. Cl.$^2$ .............................................. C23C 3/02
[52] U.S. Cl. ................................... 427/306; 156/668; 427/304; 427/307; 427/100; 428/421
[58] Field of Search ............... 427/304, 305, 306, 307, 427/100; 428/421; 156/668

[56] References Cited

U.S. PATENT DOCUMENTS

| 3,962,496 | 6/1976 | Leech ................................... 427/304 |
| 4,049,859 | 9/1971 | Yoshikawa et al. .................. 427/100 |
| 4,057,660 | 11/1977 | Yoshida et al. ....................... 427/100 |
| 4,068,034 | 1/1978 | Segawa et al. ....................... 428/421 |

OTHER PUBLICATIONS

Brenner, "Electroless Plating Comes of Age", Metal Finishing, Dec. 1954, pp. 61 to 68.

*Primary Examiner*—John D. Smith
*Attorney, Agent, or Firm*—Bruce S. Schneider

[57] ABSTRACT

A method for electroless plating relatively inert plastics, e.g., polyvinylidene fluoride, with metal, such as gold, copper or nickel has been developed. The process requires that the plastic be treated with a solvent such as n,n-dimethylformamide or dimethylsulfoxide. The plastic is then sensitized with silver followed by treatment with a suitable activator for the electroless plated solution. Continuous adherent thin films of the desired metal coating are produced.

9 Claims, No Drawings

ELECTROLESS PLATING OF POLYVINYLIDENE FLUORIDE

BACKGROUND OF THE INVENTION

1. Field of the Invention

This invention relates to electroless plating and, more particularly, to electroless plating of plastics.

2. Art Background

Various methods have been used to produce thin metal films on a substrate material. Of the typical methods, electrolytic plating, evaporation, and electroless plating are the most common. The latter has the advantage that neither a high vacuum apparatus nor the electrical accoutrements of the other two methods are required. Despite the convenience of the electrochemical method, there are also significant disadvantages. For example, plating of some materials by this method, such as plastics, has been difficult or unattainable. Typically, the metal coatings obtained do not adhere adequately to the plastic or are not uniform, i.e., have large pinholes or discontinuities. This is particularly true for the more inert plastics such as polyvinylidene fluoride (PVDF). Since these plastic materials are often used as substrates which are metal plated to make important articles, such as piezoelectric devices, the problems encountered in plating them by the more convenient electroless method is obviously a severe disadvantage.

SUMMARY OF THE INVENTION

An inert plastic, polyvinylidene fluoride (PVDF), is coated with an adherent, uniform thin metal layer, e.g., gold, copper or nickel, if a particular series of steps are performed. First the plastic is treated with a solvent for PVDF such as n,n-dimethylformamide. This treatment is then followed by exposure to silver. After these steps, plating is accomplished using previously known electroless plating solutions with their associated activators. For example, in the case of gold, the plastic is activated with a palladium compound and then immersed in an electroless plating solution. Using the steps as outlined, continuous layers which adhere even when subjected to the removal of adhesive tape from the plated surface have been obtained.

DETAILED DESCRIPTION

Continuous, adherent metal layers on polyvinylidene fluoride (PVDF) are achievable if a very particular series of steps prior to the actual electroless plating are performed. First the plastic must be treated with a solvent for PVDF. Exemplary of suitable solvents is n,n-dimethylformamide, cyclohexanone, dimethylsulfoxide or propylene carbonate. It is expedient before processing to first clean the plastic substrate to remove any grease or dirt which might interfere with the solvent treatment or other subsequent steps. Conventional methods are used for cleaning. For example, the plastic is immersed in a series of suitable solutions for removal of oil or other surface contamination such as trichlorethylene and acetone. After cleaning the treatment solvent such as DMF is then generally used for a period between 2 and 10 minutes, preferably between 3 and 5 minutes. After treatment with the solvent, the plastic substrate is rinsed and dried in preparation for subsequent steps.

The next essential step to the process after the solvent treatment is sensitization with elemental silver. This is conveniently done by first subjecting the plastic to a reducing agent and then to a silver salt. The reducing agent absorbed on the plastic subsequently reduces the silver from the salt solution onto the substrate. The particular salt used is not critical, however, for convenience it is desirable that it is soluble in a common solvent. Exemplary of suitable salts is silver nitrate. This salt is easily soluble in water and is applied to a plastic by simple immersion. Concentrations of between 1 M and 10 M, preferably between 1.5 and 2.5 M are acceptable. The plastic is left immersed, typically between 5 and 15 minutes until the entire surface of the plastic has been treated with silver. Treatment temperatures between 36 and 70 degrees C., preferably between 60 and 70 degrees C. are adequate. Lower and higher temperatures than those specified, although usable, are less efficacious and generally produce less adherent or less uniform coatings.

The silver salt is preceded by treatment with a reducing agent for silver. Compounds such as $SnCl_2$ have been found adequate for this purpose. Again the reducing agent should be soluble in a common solvent to facilitate treatment. For stannous salts, solutions in the concentration range of 1.5 M to 2.5 M are adequate when the solution is maintained at a temperature in the range of 36 to 70 degrees C., preferably in the range of 60 to 70 degrees C. For the conditions disclosed, adequate treatment times generally are from 5 to 15 minutes.

The electroless plating by the desired technique is then performed. Most electroless plating solutions require that the substrate to be plated first be treated with a catalyst. For gold, it is known that a palladium catalyst in conjunction with a gold plating solution containing $KAu(CN)_2$, KOH, KCN, and $KBH_4$ is needed. (See copending U.S. application, Ser. No. 851,612, filed Nov. 14, 1977.) The form of palladium used to activate the pretreated plastic is again conveniently a soluble salt. For example, $PdCl_2$ is easily soluble in a dilute acid solution, e.g., a water solution of HCl and glacial acetic acid. The pretreated plastic is immersed into this solution at temperatures typically between 25 and 50 degrees C., preferably in the range of 40 to 50 degrees C. Concentrations of palladium salts between 0.001 M and 0.002 M for these temperature ranges are adequate.

It should be stressed that the invention resides in the two critical steps of pretreatment with a solvent for PVDF followed by sensitization with silver. Known electroless plating solutions and their associated catalysts are then used following these necessary steps. The following examples exemplify the conditions and steps previously discussed.

EXAMPLE 1

A thin strip of PVDF measuring 0.75 in. by 0.75 in. and having a thickness of 0.005 in. was first cleaned by immersion in trichlorethylene for 4 minutes. The plastic was then immersed in acetone for an additional 3 minutes. After this cleaning, etching was performed by immersion in DMF for 3 minutes. The plastic was then rinsed thoroughly with distilled water.

Sensitization was then performed by first immersing the plastic in a 2.5 M $SnCl_2$ aqueous solution for 10 minutes. The sample was then rinsed thoroughly with distilled water and immersed for an additional 10 minutes in a 2.5 M $AgNO_3$ aqueous solution. Both solutions during these steps were kept at 70 degrees C. After the $SnCl_2$ bath, the sample was again thoroughly rinsed in distilled water followed by drying with nitrogen gas and radiant energy from a xenon lamp.

An activation solution was prepared by first dissolving 0.3 grams of $PdCl_2$ in 9 ml. of concentrated HCl. This solution was diluted with 9 ml. of distilled water and added to 864 ml. of glacial acetic acid. This combined solution was then added to 18 ml. of concentrated HCl and thoroughly mixed. The activating solution was heated to approximately 50 degrees C. and the treated plastic was immersed in it for approximately 30 minutes. The sample was thoroughly rinsed in distilled water to insure that all of the solution was removed.

A gold plating solution was prepared by first dissolving 56 grams of KOH in 50 ml. of water. Approximately 54 grams of $KBH_4$ was then added and the mixture agitated until all the solids were dissolved. A second solution was prepared by dissolving 32.5 grams of KCN in 200 ml. of water followed by addition of 4.3 grams of $KAu(CN)_2$. The mixture was agitated until all the solids dissolved. The first solution was then added to this second solution in a volumetric flask and distilled water was added to produce 1 liter of solution. This combined solution was then filtered through a Whitman No. 41 filter paper. (If the solution is to be stored before use, the storage container should be an inert plastic, such as teflon or polyproplene. Additionally, the cap to the storage container should not be tightened because hydrogen is liberated during storage.)

The gold plating solution was heated to 85 degrees C. and the plastic was immersed in it for approximately 30 minutes. No agitation was used since this produced bubbles in the solution which interfered with the uniformity of the plating. The plated plastic was then thoroughly rinsed in distilled water followed by two rinsings in warm methanol and then dried with nitrogen gas.

The resulting product has approximately a $1\mu$ thick layer of gold which had a resistivity of approximately $2.5 \times 10^{-6}$ ohm-cm. The plating appeared uniform and passed the "adhesive tape" test. That is, a piece of adhesive tape was placed onto the gold plating and then removed. None of the gold adhered to the tape.

EXAMPLE 2

The same procedure as described in Example 1 was followed except the treatment with DMF was omitted. No observable quantities of gold adhered to the plastic.

EXAMPLE 3

The same procedure as described in Example 1 was followed except treatment with the silver nitrate was omitted. Some gold adhered to the plastic, but large discontinuities in the gold plating was observed.

EXAMPLE 4

The same procedure as described in Example 1 was performed except $AgNO_3$ and $SnCl_2$ baths were maintained at 36 degrees C. An adherent gold plating was observed. However, the uniformity of this plating was somewhat degraded from that obtained in Example 1.

EXAMPLE 5

The same procedure as described in Example 1 was performed except a Cu plating solution instead of a Au plating solution was used. The Cu plating solution was made as described in *Electroplating Engineering Handbook*, 3rd Ed. Van Nostrand Reinhold Company, p. 505, Bath III. This consisted of 1.3 oz/gal. $CuSO_4.5H_2O$, 5.4 oz/gal. $NaKC_4H_4O_6.4H_2O$, 4.3 oz/gal. HCHO, 1.7 oz/gal. paraformaldehyde, and 1.3 oz/gal. NaOH. A uniform coating of Cu which passed the adhesive tape test was obtained. No catalyst, i.e., $PdCl_2$ was used for this bath.

EXAMPLE 6

The same procedure as described in Example 1 was followed except the PVDF was treated in dimethylsulfoxide for 3 minutes instead of the DMF. A uniform coating of gold which passed the adhesive tape test was obtained.

EXAMPLE 7

The same procedure as described in Example 1 was followed except the PVDF was treated in cyclohexanone for 3 minutes instead of the DMF. A uniform coating of gold which passed the adhesive tape test was obtained.

EXAMPLE 8

The same procedure as described in Example 1 was followed except the PVDF was treated in propylene carbonate for 3 minutes instead of the DMF. A uniform coating of gold which passed the adhesive tape test was obtained.

EXAMPLE 9

The same procedure as described in Example 1 was followed except a nickel plating solution instead of a gold plating solution was used. The nickel plating solution was made as described in *Electroplating Engineering Handbook*, p. 491, Bath B and consisted of 6.0 oz/gal. $NiCl_2.6H_2O$, 1.47 oz/gal. sodium hypophosphite, 13.3 oz/gal. sodium citrate, and 6.67 oz/gal. ammonium chloride. A uniform coating of nickel which passed the adhesive tape test was obtained. No catalyst, i.e., $PdCl_2$ was used for this bath.

I claim:

1. A process for electroless plating a substrate comprising the steps of exposing said substrate first to a pretreatment, then to a sensitizer and finally to a plating solution CHARACTERIZED IN THAT said substrate. is polyvinylidene fluoride, said pretreatment is a nonoxidizing solvent for said substrate and said sensitizer is elemental silver.

2. The process of claim 1 wherein said plating solution is for gold.

3. The process of claim 1 wherein said plating solution is for copper.

4. The process of claim 1 wherein the silver sensitizer is formed by reduction of a silver salt.

5. The process of claim 1 wherein said solvent is cyclohexanone.

6. The process of claim 1 wherein said solvent is propylene carbonate.

7. The process of claim 1 wherein said solvent is dimethylformamide.

8. The process of claim 1 wherein said solvent is dimethylsulfoxide.

9. The process of claims 5 or 6 or 7 or 8 wherein said silver sensitizer is formed by reduction of a silver salt.

* * * * *

UNITED STATES PATENT AND TRADEMARK OFFICE
CERTIFICATE OF CORRECTION

PATENT NO. : 4,180,602

DATED : December 25, 1979

INVENTOR(S) : Lawrence M. Schiavone

It is certified that error appears in the above—identified patent and that said Letters Patent are hereby corrected as shown below:

Column 3, line 37, "has" should read --had--.
Column 4, line 2, "$CuSO_4.5H_2O$" should read --$CuSO_4 \cdot 5H_2O$--.
Column 4, line 3, "$NaKC_4H_4O_6.4H_2O$" should read --$NaKC_4H_4O_6 \cdot 4H_2O$--. Column 4, line 37, "$NiCl_2.6H_2O$" should read --$NiCl_2 \cdot 6H_2O$--.

Signed and Sealed this

Fifteenth Day of April 1980

[SEAL]

Attest:

SIDNEY A. DIAMOND

Attesting Officer

Commissioner of Patents and Trademarks